United States Patent [19]

Doucet

[11] 4,004,196
[45] Jan. 18, 1977

[54] MULTI-LAYER PANEL BOARD WITH SINGLE-IN-LINE PACKAGE FOR HIGH SPEED SWITCHING LOGIC

[75] Inventor: Leonard A. Doucet, Norton, Mass.

[73] Assignee: Augat, Inc., Attleboro, Mass.

[22] Filed: Apr. 24, 1975

[21] Appl. No.: 571,429

[52] U.S. Cl. .............................. 317/101 CC
[51] Int. Cl.² .................................. H05K 5/00
[58] Field of Search ... 317/101 R, 101 CC, 101 CE; 339/17 CF, 276 A, 17 C, 147 R; 174/68.5

[56] References Cited

UNITED STATES PATENTS 3,891,898   6/1975   Damon ................. 317/101 CC

*Primary Examiner*—David Smith, Jr.
*Attorney, Agent, or Firm*—Weingarten, Maxham & Schurgin

[57] ABSTRACT

A multi-layer panel employing a resistor-terminator module in the form of a single-in-line package located adjacent conventional dual-in-line packages, with interconnections to be made by means of wire wrapping. The resistors in the single-in-line package have one common lead electrically connected to a conductive layer in the panel. Conductive layer surface areas are maximized for improved signal transmission characteristics.

13 Claims, 5 Drawing Figures

MULTI-LAYER PANEL BOARD WITH SINGLE-IN-LINE PACKAGE FOR HIGH SPEED SWITCHING LOGIC

FIELD OF THE INVENTION

This invention relates in general to components used in switching circuitry primarily employed in computers and more specifically concerns a printed circuit panel board used with high speed logic for such switching usage.

DISCUSSION OF THE PRIOR ART

Panel boards used for high speed logic such as transistor-transistor logic (TTL), have been widely used with wire wrapping techniques for making interconnections in logic circuitry. However, because of several problems which have been encountered, it has generally not been satisfactory to employ wire wrapping techniques with even higher speed logic in the 125 to 500+ MHz range. An example of such very high speed logic is emitter coupled logic (ECL). One of the problems encountered in an ECL board wired with normal TTL techniques is the preponderance of spurious or incorrect signals, known in the trade as glitches. The inductance and capacitance of the randomly routed wrapped wires help in coupling the fast transitions to points in the circuits other than where they were intended to go. The logic pulses are often delayed and reshaped by the reactive components of the wiring.

Attempts have been made to employ printed wiring boards, with their highly controlled and reproducable routing of signal leads, as a cure for ECL wiring problems. However, there are also difficulties associated with this hoped for solution. Printed circuit (PC) board layout requires meticulous design to provide the controlled interwiring impedances which would help to eliminate glitches. Several prototype PC boards must be designed and carefully debugged before a committment to production quantities can be made. Once finalized the design cannot be easily changed to accommodate minor variations, so the time between model updates must be stretched to the maximum to recoup the initial design costs.

A problem often overlooked with the use of PC boards for ECL applications is the increased surface area or real estate taken up to provide controlled impedances. More board area is used when spacings between planar printed conductors are spread to make room for ground or signal return paths. Fewer dual-in-line packages (DIP's) can be packed on a given size board; more boards and hardware are needed, thereby increasing the total equipment size significantly. Interconnections also grow longer and decoupling gets more difficult.

There is a technique which has been tried for applying controlled wiring impedances to ECL circuits in an effort to avoid PC wiring problems and some of the wire wrapping difficulties. This method employs three-layer boards that have built-in printed wire reference planes and special wire-wrapping signal terminating pins. These pins are preferably only long enough for two levels of wrap, rather than the three levels that are found on most standard panels. This reduces impedance discontinuities or transmission line stub effects caused by the unused length of post.

However, it has been found that three-layer ECL logic panels do not by themselves solve the problems. The interwiring must be treated as a specialized energy transmission system and not as a single line drawn on a schematic diagram which simply serves as a reminder of where a signal should go. The complete transmission system must absorb all the energy sent from the source to the load and not allow any to reflect back to the source, causing transient build-up, ringing and spikes. This planned-for absorption of energy makes the difference between a successful and an unsuccessful application of wire-wrapping techniques to ECL circuits. Part of the plan requires a printed circuit terminating bus or voltage plane built into the logic panel. This widespread plane eliminates awkward terminating network and pull-down resistor locations and allows higher packaging density. This tighter packaging also cuts down inter-wiring path lengths to further reduce wiring delays.

The pull-down or terminating resistors needed for ECL panels are not extraneous components that must be called upon to make the wiring system work. They are components which are already needed in the ECL circuitry. This requirement has previously been satisfied through the use of discreet carbon composition resistors with their leads to be interconnected by means of wire wrapping techniques to the contact pins of the panel boards. While this may be useful for purposes of constructing prototypes and breadboards, it is relatively difficult to handle a large number of such components in the small spaces available and production labor costs remain high.

SUMMARY OF THE INVENTION

The problems associated with attempts to employ TTL wire wrapping interconnection techniques with emitter coupled logic is substantially vitiated by the present invention. This invention comprises a multi-layer panel board having three voltage planes in combination with one or more single-in-line package (SIP) termination resistor networks. A common lead of all of the resistors in a SIP is electrically connected to one of the voltage planes which acts as a voltage bus. Thus production and handling problems which occurred through the use of discreet resistors are substantially reduced by forming terminating resistors in the configuration of a SIP. The lead common to the resistors in the SIP is electrically connected to the intermediate voltage plane ($V_{TT}$). This plane is sandwiched between the $V_{CC}$ and $V_{EE}$ voltage planes which also provide low impedance power distribution.

The ECL panel of this invention employs a row of socket contacts located adjacent to one or between two dual-in-line patterns or arrays of socket contacts which normally accommodate a DIP. One of the contacts of the single-in-line row is coupled to the middle or $V_{TT}$ plane, while the rest are floating contacts which may be interconnected as desired with conventional wire wrapping techniques.

Another aspect of the invention is that the amount of conductive material etched away in the vicinity of the dual-in-line terminal arrays has been reduced approximately 20% for improved transmission characteristics of the switching signals.

BRIEF DESCRIPTION OF THE DRAWING

The advantages, features and objects of this invention will be more clearly understood from the following detailed description when taken in conjunction with the drawing in which.

DESCRIPTION OF THE PREFERRED EMBODIMENT

Figure 1:
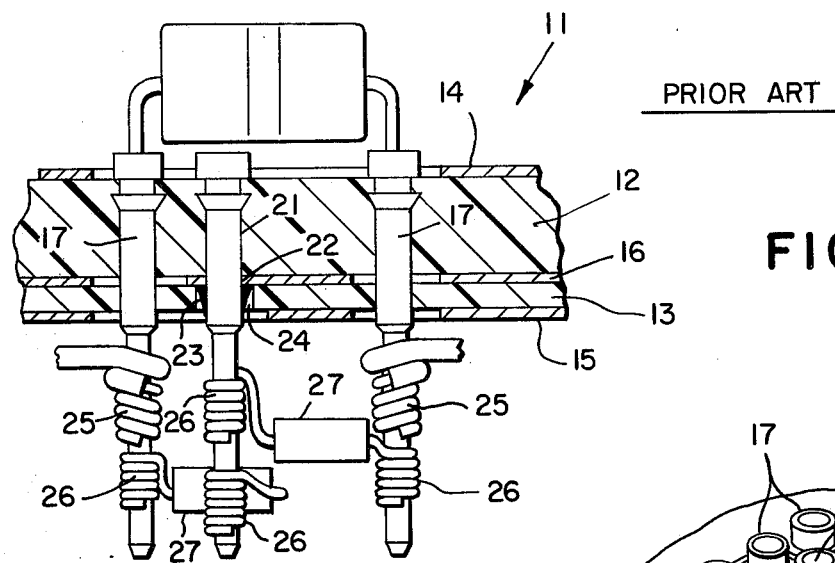
FIGS. 1 and 2 show a single dual-in-line contact array with an intermediate row of contacts of the prior art as employed in a three level panel.
Figure 2:
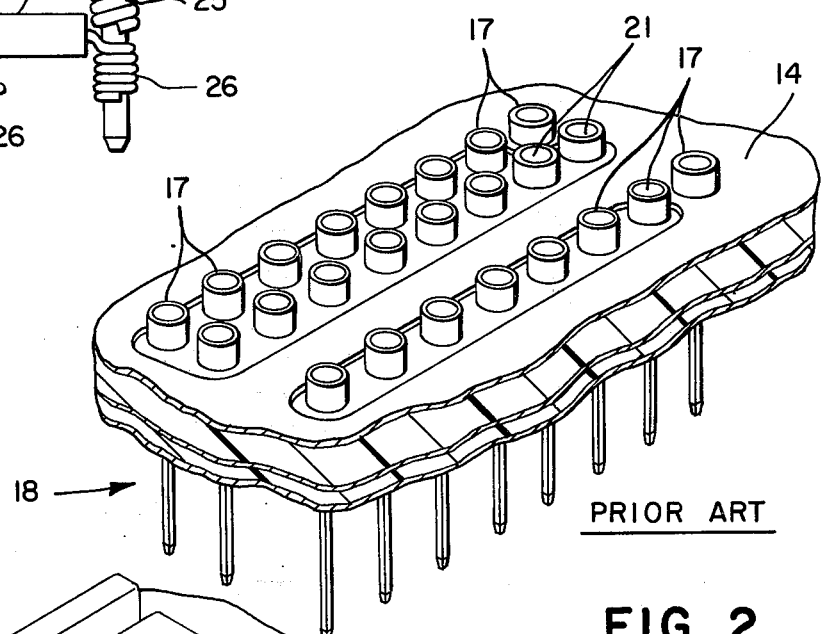

With reference now to the drawing, the prior art is shown in FIGS. 1 and 2. A three-layer panel board 11 is comprised of a thick layer 12 and a thin layer 13 of conventional insulating board such as glass epoxy. Conductive metal voltage plane 14 is located on the module side of the board and is normally designated $V_{CC}$ which may be ground or zero voltage plane. Voltage plane 15 is located on the pin side of the board and is normally designated $V_{EE}$ and typically has a voltage supply of −5.2 volts. Intermediate conductive plane 16 between the insulating layers is normally designated $V_{TT}$ and provides a −2 volt supply in this example. Socket contacts 17 are mounted in parallel twin rows in the usual dual-in-line (DIL) array. Located between these two rows of socket contacts in each array are dummy contact pins 21, some of which may be electrically connected to intermediate voltage plane 16 as indicated at 22. Pin 21 is connected to plane 16 by means of solder 23, with access being gained through board portion 13 by means of hole 24. It is thus possible to make several independent interconnections to voltage plane 16 by means of wire wrapping pins 21. Connections to external circuitry by means of wraps 25 are shown in connection with socket contacts 17 while leads 26 of discrete resistors 27 are shown connecting the resistors between dummy pins 21 and sockets contacts 17. This configuration has previously been used for fast computer logic boards and the interconnections thereon. Note in FIG. 2 that two of the socket contacts of the dual-in-line array 18 are electrically connected to voltage plane 14 which covers a majority of the component side of the panel while the remainder of the socket contacts and all of the dummy pins 21 are electrically isolated from voltage plane 14. One socket contact is electrically connected to voltage plane 15, and the remainder of socket contacts 17 are electrically isolated from voltage planes 15 and 16 so that they may be interconnected as desired by wire wrapping techniques. Several of pins 21 may remain floating, unconnected to any voltage plane, to be used as interconnecting means wherever desired in the circuitry.

Figure 3:
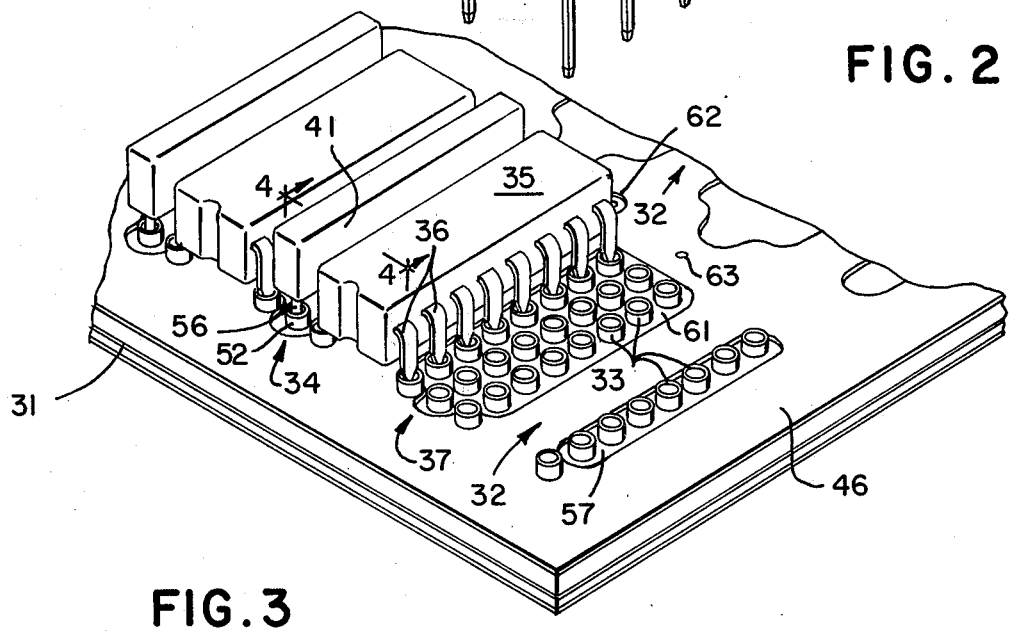
FIG. 3 is partial perspective view of a panel board constructed in accordance with the present invention showing both DIP's and SIP's in some of the socket contact arrays of the board.
Figure 4:
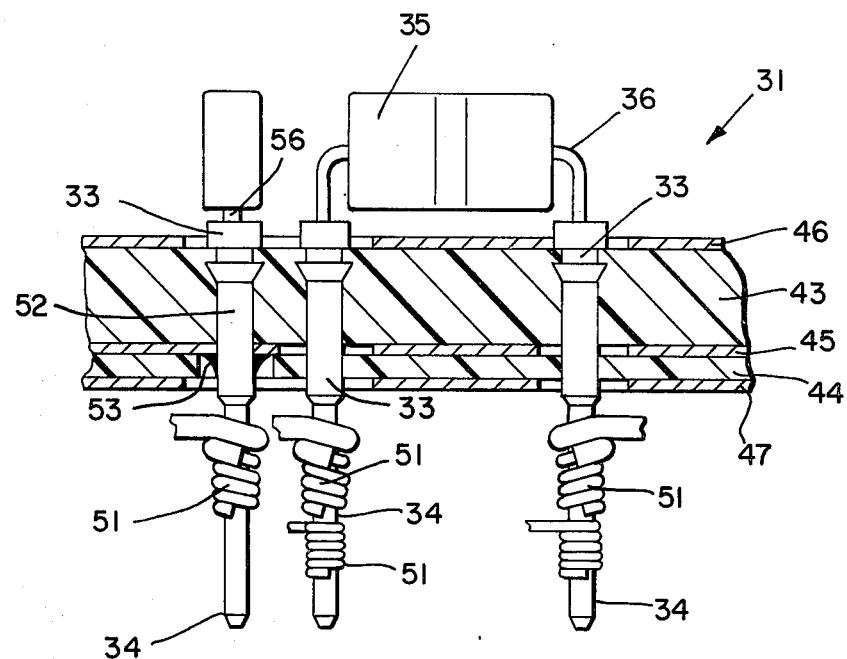
FIG. 4 is an enlarged sectional view taken along cutting plane 4—4 of FIG. 3 showing the relative positions of the DIP and SIP.

With reference now to FIGS. 3 and 4 the structure of the present invention is shown in detail. Panel board 31 has a three-layer configuration similar to that shown in FIGS. 1 and 2 and is formed with a plurality of dual-in-line arrays 32 of socket pins 33 having wire wrapping extensions 34 projecting from the panel board on the side opposite the sockets. A conventional integrated circuit package 35 in dual-in-line configuration is shown mounted in an array 32 having leads 36 snugly engaged within socket contacts 33. Between each dual-in-line array 32 is a single-in-line array or row 37 of socket contacts 33 also having wire wrapping pins projecting from the opposite side of the board. This single-in-line array is adapted to receive a resistor terminator single-in-line package (SIP) 41 which is preferably a parallel network of resistors. Straight leads 42 (FIG. 5) project downwardly from the SIP and are also snugly engaged within socket contacts 33 in row 37.

Panel board 31 is a multi-layer board as shown in FIG. 4 having a dielectric laminate or layer 43 separated from dielectric laminate or layer 44 by means of conductive plane 45 which is $V_{TT}$ or the −2 volt plane. This voltage plane provides a low impedance common return path for the logic pulses. On the component side of panel 31 is conductive plane 46 which is $V_{CC}$ or the ground plane which is at zero volts DC, and on the pin side of the board is conductive plane 47 which is $V_{EE}$ or the −5.2 volt plane. It is evident that each of pins 33 of the dual-in-line array which receives leads 36 of DIP 35 are socket contacts with wire wrapping projections 34. Likewise, contact pins 33 which receive leads 42 of SIP 41 also have wire wrapping pin projections 34. Each of the wire wrapping pins may be interconnected by means of wire wrapping techniques, the wire wrapping coils being indicated by reference numerals 51.

Figure 5:
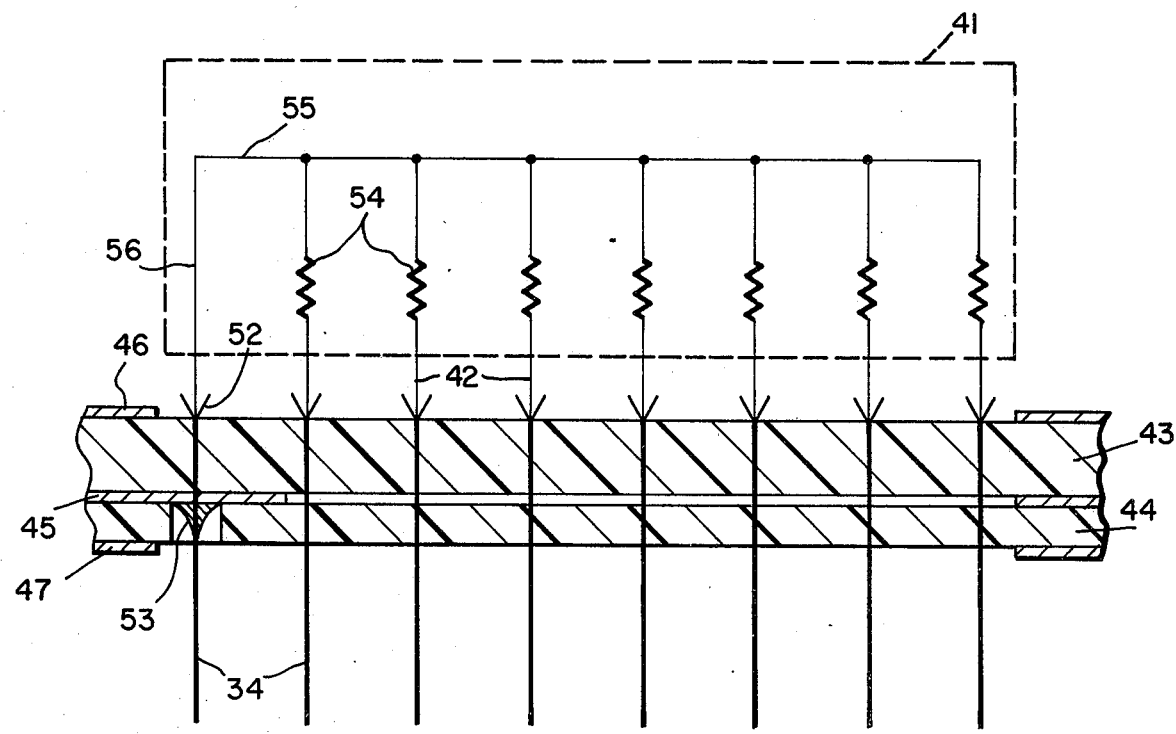
FIG. 5 is a schematic representation of the resistive network of the SIP and its physical and electrical contacts with the multi-layer board.

It may be seen that socket contacts 33 are normally floating whether in the dual-in-line array or the single-in-line row. However, reference to FIGS. 4 and 5 shows end socket contact 52 of row 37 being electrically connected to voltage plane 45 by such means as solder 53. This is the common connection for resistors 54 within SIP 41 each of which is electrically coupled to common path 55 connected to lead 56 at one end of the SIP. It is thus apparent that with common conductor 55 connected to the −2 volt plane, one end of each of resistors 54 is coupled to this voltage plane 45 and the other end of each resistor may be coupled by a wire wrapping means to any other location on the panel board, normally to terminals of adjacent or far removed DIP's. This configuration removes the requirement for wire wrapping discreet resistors between wire wrapping pins 34 since it is only necessary now to use conventional wires between those pins. Generally the resistors in the SIP have values of ⅛ watt, 120 ohms, although different values could be employed.

Previously it has been standard to etch voltage plane 46 around contact pins 33 to a width of approximately 0.160 inch. This area, as indicated by reference numeral 57 in FIG. 3 has been reduced to approximately 0.125 inch wide, although it may be as wide as 0.140 inch, thereby providing a greater amount of conductive material over the entire surface of the voltage plane in order to effectively handle greater current and power. This larger amount of conductive material improves transmission characteristics in fast switching ECL boards because there is more conductive material and consequently less impedance and signal reduction. Likewise, in etched areas 61 which include two sides of adjacent DIL arrays surrounding a single-in-line row 37 the etching is approximately 0.025 inch beyond the edges of contact sockets 33 in the rows closest to the voltage plane 46 whereas it was previously 0.045 inch in the prior art. Again, by increasing the amount of conductive material available, normally copper, the transmission characteristics of the panel board are significantly improved. Note that one end socket contact of each row in DIL arrays is electrically connected to voltage plane 46. Likewise, at least one such contact in each array is electrically connected to voltage plane 47.

Holes 62 and 63 are provided through panel board 31 for purposes of decoupling the −5.2 volt plane $V_{EE}$ (47) and the −2 volt plane $V_{TT}$ (45) by employing a decoupling capacitor. Voltage plane 46 is etched away around holes 62 while holes 63 provide direct connection of a capacitor lead to voltage plane 46. Holes 62 are, on the other hand, coupled to voltage plane 45 within the panel board and access is provided through board laminate 44 so that a lead projecting through hole 62 may be soldered to the internal plane 45 similar to that indicated by reference numeral 53 in FIG. 4. Soldering of a capacitor lead directly to plane 46 on the surface of the board is easily accomplished. Any type of decoupling capacitor may be connected as desired. Also the same technique may be used to decouple any two voltage planes of the board.

The DIL arrays 32 are normally provided in multiples of 30 in five-by-six pattern whereas the single-in-line rows are preferably provided between the DIL arrays in multiples of 24 in a four-by-six pattern. One may thus order any practical number of DIL arrays in this logic panel configuration between 30 and 180 in multiples of 30. There are other possible configurations and sizes to accommodate different types of DIP's. Also the single-in-line rows may be provided adjacent any DIL array, not just between two such arrays so that the ratio of DIP's to SIP's need not be five-to-four as in the specific example shown.

All of the voltage planes 45, 46 and 47 provide low impedance power distribution. The capacitance between each voltage plane is about 1,000 pf for a 180 DIP panel, enough to provide a low-noise reference plane for most applications. The decoupling holes 62 and 63 may be used for additional decoupling capacitors where they are found to be necessary as previously described. Crosstalk, which is the undesired coupling between signal wires, is also reduced by the expanded copper area of the −5.2 volt plane 47 ($V_{EE}$). If bus wires were used to rout the $V_{EE}$, $V_{CC}$ and $V_{TT}$ power levels, mutual coupling would produce a large number of pulses in adjacent signal lines. However, by making the $V_{EE}$ distribution through a large plane occupying a majority of the surface area of the panel board on the pin side thereof, the mutual coupling is effectively reduced between signal and power lines. Crosstalk is also reduced by the low impedance of the large area of the $V_{TT}$ line (voltage plane 45). It is sandwiched between the $V_{CC}$ and $V_{EE}$ voltage planes to eliminate the need for signal return wires, thus cutting interconnections in half.

While the panel configuration of this invention has been described as being particularly adapted for ECL use, it is applicable for any fast switching logic systems. If desired, one of the voltage planes could be separated into two independent adjacent areas to provide yet a fourth voltage bus. Specific examples of the voltage employed on the conductive planes have been used in the above detailed description. However, it is within the skill in the art to vary the reference voltage levels, and to use different planes for ground and the various voltage supplies.

By way of further example, some dimensions are herewith provided. The socket contacts are on a modular spacing of 0.100 inch centers in a row and rows in a DIL array are spaced by 0.300 inch. The SIP row is spaced 0.100 inch from adjacent DIL arrays. The panel itself is approximately 0.125 inch thick, while the wire wrapping pins normally extend approximately 0.400 inch from the panel surface. The thickness of the conductive planes is shown greatly exaggerated for purposes of clarity.

In view of the above detailed description, it is likely that many modifications and improvements will occur to those skilled in the art which are within the scope of this invention.

What is claimed is:

1. An improved multi-layer panel board comprising:
   a first dielectric laminate;
   a second dielectric laminate in face-to-face confronting relationship with said first dielectric laminate;
   a first conductive plane located between said first and second dielectric laminates;
   a second conductive plane on the outside of said second dielectric laminate;
   a third conductive plane on the outside of said first dielectric laminate;
   said panel board being formed with a plurality of dual-in-line arrays of holes therethrough, said arrays being arranged in regular parallel and end-to-end relationship over the surface of said panel board;
   a plurality of single-in-line rows of holes adjacent of said dual-in-line arrays;
   a socket contact mounted in each of said holes in said dual-in-line arrays of holes and in each of said single-in-line rows of holes, said socket contact having a socket projecting into said panel board from one side thereof and a contact pin extending from the opposite side of said panel board;
   means connecting one of said conductive planes to at least one of said socket contacts in each of said single-in-line rows of holes; and
   a single-in-line package having a row of electrical leads extending from one edge thereof, one of said leads being received in each of said sockets of said socket contacts in one of said single-in-line rows.

2. The panel board recited in claim 1 wherein said single-in-line package has a resistive network therein with a resistor connected to each of said electrical leads but one, the other end of each resistor being connected through a common conductor to the last of said electrical leads of said single-in-line package.

3. The panel board recited in claim 2 wherein:
   one of said socket contacts in said single-in-line row is electrically connected to said first conductive plane; and
   said one of said electrical leads of said single-in-line package is inserted in said one socket contact.

4. The panel board recited in claim 3 wherein said second dielectric laminate has a hole therethrough to provide access for soldering said one of said socket contacts to said first conductive plane.

5. The panel recited in claim 4 and further comprising wire wrapping interconnections between selected ones of said socket contact pins in said dual-in-line arrays and said single-in-line rows.

6. The panel board recited in claim 1 wherein adjacent dual-in-line arrays are spaced by 0.2 inch and said single-in-line rows are spaced 0.1 inch from adjacent dual-in-line arrays.

7. The panel board recited in claim 1 wherein each of said socket contacts is laterally spaced from the closest non-contacting conductive planes by 0.025 inch.

8. An improved multi-layer panel board comprising:

a first dielectric laminate;

a second dielectric laminate in face-to-face confronting relationship with said first dielectric laminate;

a first conductive plane located between said first and second dielectric laminates;

a second conductive plane on the outside of said second dielectric laminate;

a third conductive plane on the outside of said first dielectric laminate;

said panel board being formed with a plurality of dual-in-line arrays of holes therethrough, said arrays being arranged in regular adjacent parallel and end-to-end relationship over the surface of said panel board;

a plurality of single-in-line rows of holes adjacent said dual-in-line arrays;

a socket contact mounted in each of said holes in said dual-in-line arrays of holes and in each of said single-in-line rows of holes, said socket contact having a socket projecting into said panel board from one side thereof and a contact pin extending from the opposite side of said panel board; and means connecting one of said conductive planes to at least one of said socket contacts in each of said single-in-line rows of holes;

said single-in-line row of holes being adapted to receive the leads of a single-in-line package.

9. The panel recited in claim wherein one of said socket contacts in said single-in-line row is electrically connected to said first conductive plane.

10. The panel board recited in claim 9 wherein said second dielectric laminate has a hole therethrough to provide access for soldering said one of said socket contacts to said first conductive plane.

11. The panel board recited in claim 10 and further comprising wire wrapping interconnections between selected ones of said socket contact pins in said dual-in-line arrays and said single-in-line rows.

12. The panel board recited in claim 11 wherein adjacent dual-in-line arrays are spaced by 0.2 inch and said single-in-line rows are spaced 0.1 inch from adjacent dual-in-line arrays.

13. The panel board recited in claim 12 and further comprising a single-in-line package having a row of electrical leads extending from one edge thereof, one of said leads being received in each of said sockets of said socket contacts in one of said single-in-line rows.

* * * * *

UNITED STATES PATENT AND TRADEMARK OFFICE
CERTIFICATE OF CORRECTION

PATENT NO. : 4,004,196
DATED : January 18, 1977
INVENTOR(S) : Leonard A. Doucet

It is certified that error appears in the above-identified patent and that said Letters Patent are hereby corrected as shown below:

Column 6, line 57, after "panel" insert --board--.
Column 8, line 6, after "panel" insert --board-- and after "claim" insert --8--.

Signed and Sealed this

Seventh Day of April 1981

[SEAL]

Attest:

RENE D. TEGTMEYER

Attesting Officer    Acting Commissioner of Patents and Trademarks

UNITED STATES PATENT AND TRADEMARK OFFICE
Certificate

Patent No. 4,004,196                                                                Patented Jan. 18, 1977

Leonard A. Doucet

Application having been made by Leonard A. Doucet, the inventor named in the patent above identified, and AUGAT, Inc., a Massachusetts Corp., the assignee, for the issuance of a certificate under the provisions of Title 35, Section 256, of the United States Code, adding the name of Douglas M. Sawyer as a joint inventor, and a showing and proof of facts satisfying the requirements of the said section having been submitted, it is this 28th day of July 1981, certified that the name of the said Douglas M. Sawyer is hereby added to the said patent as a joint inventor with the said Leonard A. Doucet.

Fred W. Sherling
*Associate Solicitor.*